(12) United States Patent
Ledford et al.

(10) Patent No.: US 6,347,056 B1
(45) Date of Patent: Feb. 12, 2002

(54) RECORDING OF RESULT INFORMATION IN A BUILT-IN SELF-TEST CIRCUIT AND METHOD THEREFOR

(75) Inventors: James S. Ledford, Cedar Park, TX (US); Alex S. Yap, New York, NY (US); Brian E. Cook, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/859,333

(22) Filed: May 16, 2001

(51) Int. Cl.[7] .................................................. G11C 7/00
(52) U.S. Cl. ....................................................... 365/201
(58) Field of Search ........................... 365/201, 189.01; 364/578; 711/106; 714/30

(56) References Cited

U.S. PATENT DOCUMENTS 5,751,729 A * 5/1998 Aybay ........................ 371/21.1

OTHER PUBLICATIONS

Alfred L. Crouch, "Design–for–Test for Digital IC's and Embeddded Core Systems", 1999 by Prentice Hall, pp. 218–235.

Jeffrey Dreibelbis et al, "Processor–Based Built–In Self–Test for Embedded DRAM", IEEE Journal of Solid State Circuits, vol. 33, No. 11, Nov. 1998, pp. 1731–1739.

* cited by examiner

Primary Examiner—Vu A. Le
(74) Attorney, Agent, or Firm—Robert L. King; James L. Clingan, Jr.

(57) ABSTRACT

An integrated circuit has a Built-In Self-Test (BIST) controller (10) that has a sequencer (16) that provides test algorithm information for multiple memories (44, 46, 48, 50). The sequencer identifies the test algorithm that is to be performed and multiple memory interfaces (32, 34, 36, 38) interpret the output of the sequencer and perform the algorithm on the multiple memories. The multiple memories may be different or the same regarding type, size, data widths, etc. Having multiple memory interfaces provides flexibility to tailor the test algorithm for each memory, but yet keeps the advantage of a single source of identifying the test algorithm. With the memories being non-volatile, timing information with regard to the test algorithm is stored in the memories. When test algorithms fail or complete execution, pertinent BIST information is stored in non-user addressable space of the multiple memories.

23 Claims, 5 Drawing Sheets

RECORDING OF RESULT INFORMATION IN A BUILT-IN SELF-TEST CIRCUIT AND METHOD THEREFOR

RELATED APPLICATIONS

This application is related to the following copending U.S. Pat. applications: Ledford et al., U.S. Ser. No. 09/859,324, entitled "Multiple Level Built-In Self-Test Controller And Method Therefor" and Ledford et al., U.S. Ser. No. 09/859,326, entitled "External Control Of Algorithm Execution In A Built-In Self-Test Circuit and Method Therefor" both filed on even date herewith.

FIELD OF THE INVENTION

This invention relates generally to testing of integrated circuits, and more specifically, to testing of memories on integrated circuits.

BACKGROUND OF THE INVENTION

Memory built-in self-test (BIST) circuitry is commonly found on integrated circuits having embedded memory for the purpose of verifying that the embedded memory may be written and/or read properly over the life of the integrated circuits. In such forms, the embedded memory is dynamic random access memory (DRAM) or static random access memory (SRAM) as there are known fixed test algorithms which may commonly be used for various circuit and process implementations of volatile memory. Users of such integrated circuits are typically unaware of the BIST circuitry which functions primarily as manufacturing test mechanism. For this reason and others, there is a desire to minimize the amount of die area that is used for the BIST function.

Integrated circuits are commonly using embedded memories that are non-volatile. These non-volatile memories, other than Read-Only Memories (ROMs), are generally more complex to test than volatile memories. For example, non-volatile memories are implemented with various memory cell circuit designs and using different processing technologies. Additionally, some circuit designs have embedded memory arrays using different non-volatile memory types, such as flash (bulk erased) or electrically erasable (byte/word erasable). Different erasing, programming, read and stress algorithms are required for each different type of non-volatile memory. Such integrated circuits as a result generally have not implemented built-in self-test controllers. When testing of integrated circuits having non-volatile memory arrays is performed, increased test time and cost is typical because of the increased test complexity as compared with the testing of embedded volatile memories.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors that may be used to transfer one or more various types of information, such as data, addresses, control, or status. The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
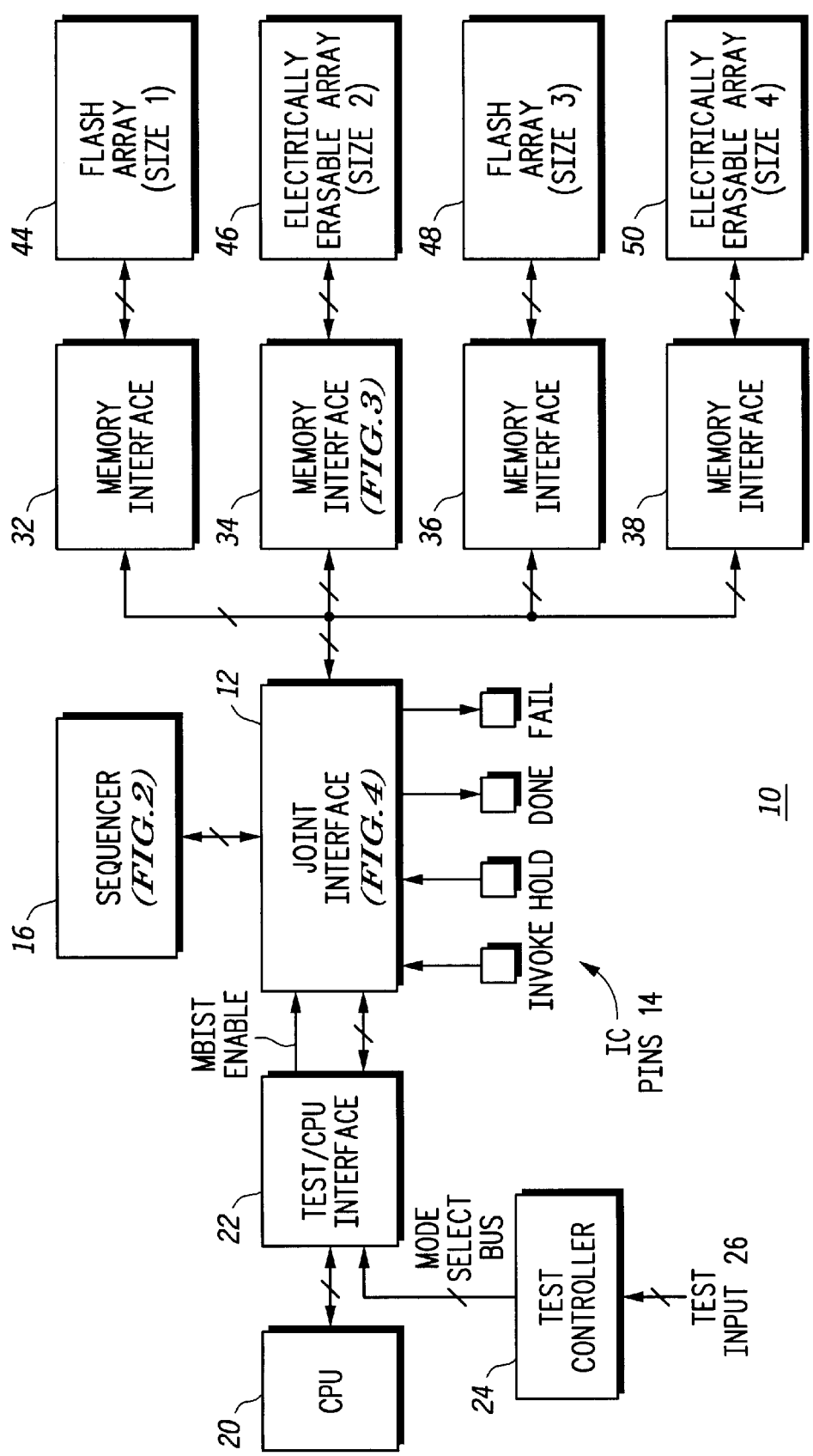
FIG. 1 illustrates in block diagram form a built-in self-test system in accordance with an embodiment of the present invention.

FIG. 1 illustrates in block diagram form a Built-In Self-Test (BIST) controller in the form of Built-In Self-Test (BIST) System 10 for use in an integrated circuit. A Joint Interface 12 is connected to a plurality of Integrated Circuit (IC) Pins 14. In the illustrated form, the IC pins include such functions as an INVOKE function, a HOLD function, a DONE indicator and a FAIL indicator. Joint Interface 12 is bidirectionally connected via a bus to a Sequencer 16. A central processing unit (CPU) 20 is connected by a bidirectional bus to a first input of a Test/CPU Interface 22. A Test Controller 24 receives a Test Input 26 and has an output that is connected to a second input of Test/CPU Interface 22 via a multiple bit mode select bus. A first output of Test/CPU Interface 22 is connected to an input of Joint Interface 12 to provide a memory BIST (MBIST) Enable signal. Test/CPU Interface 22 and Joint Interface 12 are also bidirectionally connected via a multiple bit separate bus. An input/output terminal of Joint Interface 12 is connected to a respective input/output terminal of each of a plurality of Memory Interface circuits 32, 34, 36 and 38. Each of Memory Interface circuits 32, 34, 36 and 38 has a second input/output terminal. The second input/output terminal of Memory Interface 32 is connected to an input/output terminal of a Flash array 44 having a first size, Size 1. The second input/output terminal of Memory Interface 34 is connected to an input/output terminal of Electrically Erasable Array 46 having a second size, Size 2. The second input/output terminal of Memory Interface 36 is connected to an input/output terminal of a Flash Array 48 having a third size, Size 3. The second input/output terminal of Memory Interface 38 is connected to an input/output terminal of Electrically Erasable Array 50 having a fourth size, Size 4.

It should be understood that although the BIST System 10 is illustrated in connection with specific types of memory arrays or memory devices, the present invention may be utilized in connection with any type of memory. For example, instead of using Flash or Electrically Erasable arrays, memories such as DRAM, SRAM, MRAM (Magnetoresistive Random Access Memory) and FeRAM (Ferroelectric Random Access Memory) and any other known or subsequently developed memory may be used in the present invention.

In operation, BIST System 10 is implemented on an integrated circuit that has one or more memory array configurations. In the illustrated form, four memory array configurations are shown having four different sizes. It should be well understood that the present invention may be implemented with any number, type and size of memory arrays. For example, all memory arrays may have the same size and the present invention may also be practiced using only a single memory array. First, the MBIST Enable signal from Test/CPU Interface 22 must be asserted. The MBIST Enable signal may be asserted either in response to the Test Input 26 or the CPU 20. The Test Input 26 may cause the Test Controller 24 to assert the MBIST Enable signal through the Mode Select Bus. The CPU 20 may also assert the MBIST Enable signal. In response to an assertion of the MBIST Enable signal, the BIST circuitry in Joint Interface 12, Sequencer 16 and Memory Interfaces 32, 34, 36 and 38 can be initialized via a sequence of events. The initialization step will be further described in detail in connection with FIGS. 2, 3, 4 and 5. After initialization, the most common way to invoke the testing is to assert the INVOKE pin of IC pins 14. In another form, the CPU 20 could invoke the testing through the Test/CPU Interface 22. Once invoked, Sequencer 16 will issue one of a series of commands via a bidirectional control bus between Sequencer 16 and Joint Interface 12. In response, Joint Interface 12 dispatches the command to one or more of the selected Memory Interfaces 32, 34, 36 and 38. The selected Memory Interface(s) will execute a test algorithm based upon the command that is received. In response to the execution of the test algorithm, the selected Memory Interface(s) controls its associated memory array to implement a predetermined test memory operation. If the test memory operation involves the reading of data, a compare of such data to an expected value is provided by the selected Memory Interface(s) as either a pass or fail indication. A pass or fail indication is routed from the selected Memory Interface(s) to Joint Interface 12 and forwarded to Sequencer 16. If any memory array test fails, Sequencer 16 and Joint Interface 12 function to assert the Fail IC pin of IC pins 14. Upon completion of the algorithm in one or more of the selected Memory Interfaces, a DONE indicator is routed from one or more selected Memory Interfaces to Joint Interface 12 and forwarded to Sequencer 16. Subsequently, the DONE pin of IC pins 14 is asserted. This discussion of the execution of a command is repeated for all other commands issued by Sequencer 16.

Figure 2:
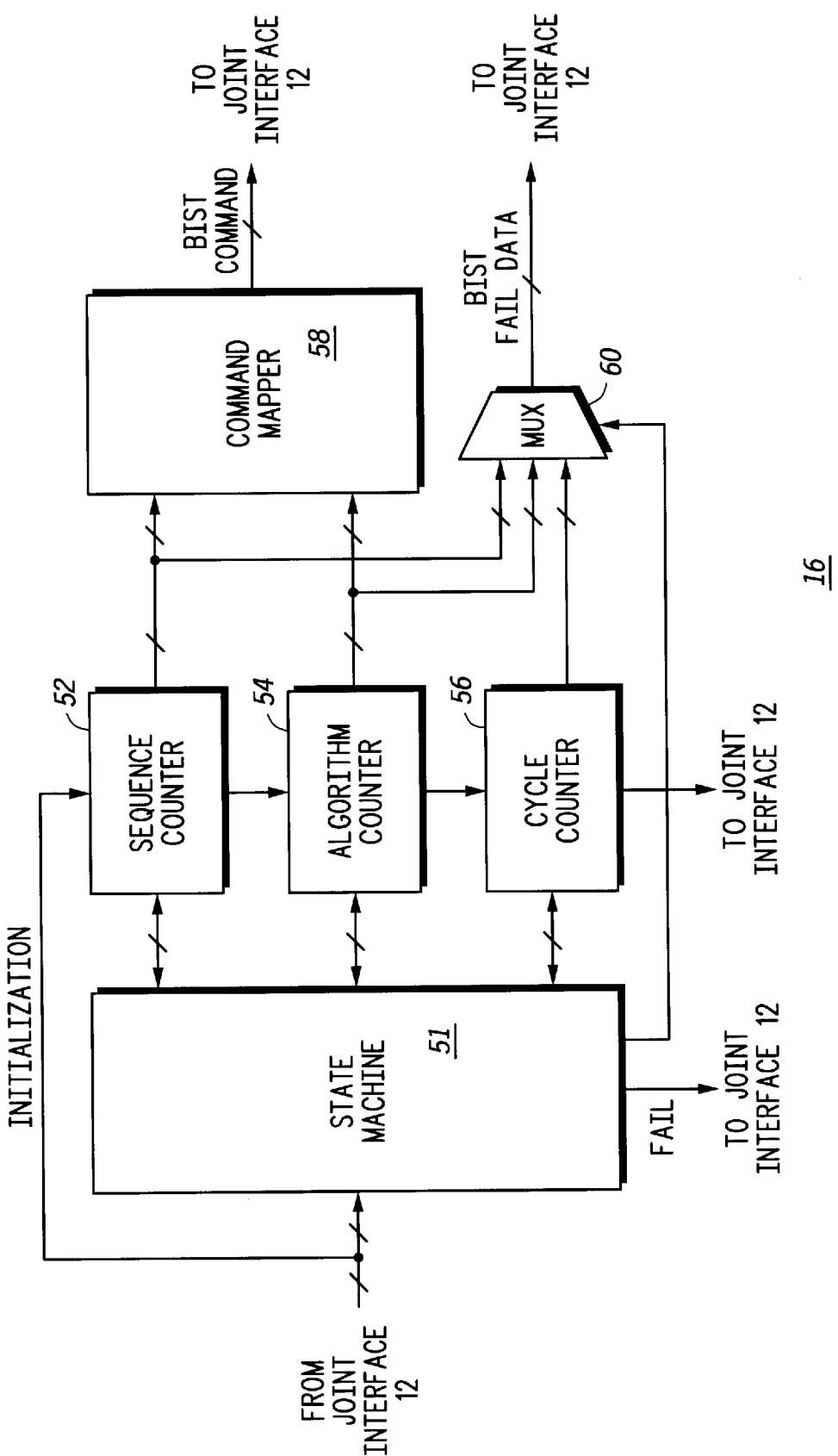
FIG. 2 illustrates in block diagram form one form of the sequencer of the built-in self-test system of FIG. 1.

Illustrated in FIG. 2 is a block diagram of Sequencer 16 of FIG. 1. In the illustrated form, a State Machine 51 has an input connected to the Joint Interface 12. An output of State Machine 51 provides a Fail indicator to Joint Interface 12. A first input/output terminal of State Machine 51 is connected to an input/output terminal of a Sequence Counter 52. A second input/output terminal of State Machine 51 is connected to an input/output terminal of an Algorithm Counter 54. A third input/output terminal of State Machine 51 is connected to an input/output terminal of a Cycle Counter 56. An initialization input of Sequence Counter 52 is connected to an initialization path from Joint Interface 12. An initialization output of Sequence Counter 52 is connected to an initialization path input of Algorithm Counter 54. An initialization output of Algorithm Counter 54 is connected to an initialization path input of Cycle Counter 56. The initialization path exits Cycle Counter 56 and is connected back to Joint Interface 12. An output of Sequence Counter 52 is connected to both a first input of a Command Mapper 58 and to a first input of a Multiplexer (MUX) 60. An output of Algorithm Counter 54 is connected to a second input of Command Mapper 58 and to a second input of Multiplexer 60. An output of Cycle Counter 56 is connected to a third input of Multiplexer 60. A control input of Multiplexer 60 is connected to State Machine 51 for receiving a control signal. An output of Command Mapper 58 is connected to Joint Interface 12 and provides the BIST Command signal. An output of Multiplexer 60 is connected to the Joint Interface 12 and provides the Fail information labeled BIST Fail Data.

During the initialization mode, the Joint Interface 12 passes an initialization vector to load into Sequence Counter 52, Algorithm Counter 54 and Cycle Counter 56. The initialization vector is provided via the Hold pin of IC pins 14. State Machine 51 controls the initialization mode. Additionally, State Machine 51 controls the command sequencing to complete the BIST operation. Prior to discussion of Sequence Counter 52, Algorithm Counter 54 and Cycle Counter 56, a brief discussion of the functions of sequencing, algorithm counting and cycle counting will be provided. To implement a BIST flow, a sequence of specific, predetermined algorithms are chosen. Each sequence can have one or more algorithms associated with the sequence. Typically, four or more algorithms are associated with a sequence. Additionally, some sequences are cycled meaning that the algorithms of the sequence are repeated a predetermined number of times. The function of the Cycle Counter 56 is to set the number of times the algorithms are repeated and that number is established during initialization. The command sequencing results in the execution of test algorithms chosen to implement a predetermined BIST operation. As part of the BIST execution, State Machine 51 indexes (decrements or increments) the Sequence Counter 52, the Algorithm Counter 54 and the Cycle Counter 56 as needed. Command Mapper 58 translates a sequence count and algorithm count to a specific BIST command signal (a sequencing control signal). State Machine 51 controls Multiplexer 60 to send specific Fail Data to Joint Interface 12 which is routed to a failing Memory Interface if a Fail indication has been detected. The Fail Data represents the Sequence, Algorithm and Cycle at which the failure occurred. It should be well understood that Sequencer 16 could be implemented with a ROM-based controller or other types of controllers and is provided as an exemplary embodiment only.

Figure 3:
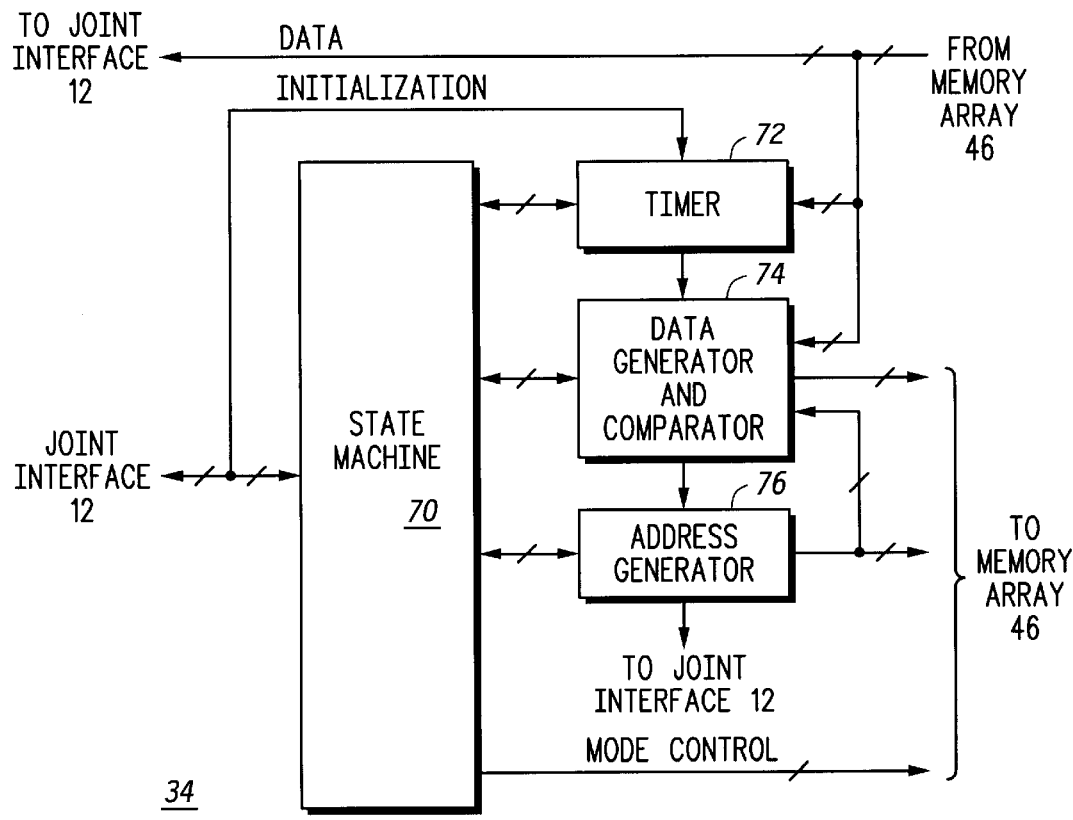
FIG. 3 illustrates in block diagram form one form of one of the memory interfaces of the built-in self-test system of FIG. 1.

Illustrated in FIG. 3 is a detail of one of the Memory Interfaces such as Memory Interface 34. A State Machine 70 has a first input/output terminal connected to Joint Interface 12. An initialization input of a Timer 72 is connected to Joint Interface 12. A second input/output terminal of State Machine 70 is connected to a first input/output terminal of Timer 72. Data from Memory Array 46 is connected to a second input of Timer 72. A third input/output terminal of State Machine 70 is connected to an input/output terminal of a Data Generator and Comparator 74. An initialization output of Timer 72 is connected to an initialization input of Data Generator And Comparator 74. Data from Memory Array 46 is connected to a second input of Data Generator And Comparator 74. The data is further coupled to the Joint Interface 12 through Memory Interface 34. An initialization output of Data Generator And Comparator 74 is connected to an initialization input of an Address Generator 76. A fourth input/output terminal of State Machine 70 is connected to an input/output terminal of an Address Generator 76. An output of Address Generator 76 is connected to a second input of the Data Generator and Comparator 74. The Address Generator 76 has an initialization output connected to the Joint Interface 12. The State Machine 70 has an output connected to a multi-bit Mode Control bus. The first output of each of Data Generator and Comparator 74 and Address Generator 75 and the Mode Control bus are connected to Electrically Erasable Array 46.

In operation, Memory Interface 34 uses a State Machine 70 to control the initialization of each of Timer 72, Data Generator and Comparator 74 and Address Generator 76 during an initialization step of a BIST operation. Initialization of predetermined values into Timer 72, Data Generator and Comparator 74 and Address Generator 76 is required due to the fact that differing memory arrays may be used which have differing operating characteristics. For example, the value stored in Timer 72 is specific to the timing characteristics of Electrically Erasable Array 46 for which Memory Interface 34 controls. Subsequent to the initialization mode, Electrically Erasable Array 46 may provide to Timer 72 and other portions of Memory Interface 34 stored parameters (e.g. timing, algorithm modifiers, etc.) required by algorithms used by the State Machine 70 to program, erase, read and stress test Electrically Erasable Array 46. Such stored parameters are stored in Electrically Erasable Array 46 typically in non-user addressable locations. Therefore, in System 10 different timing values, such as program and erase pulse widths, are required for each analogous Timer 72 in the Memory Interfaces since different types of Non-Volatile Memories may have different values. Data Generator And Comparator 74 must be initialized with data values which are unique to the various memory arrays. Address Generator 76 must be initialized with addresses identifying where in Electrically Erasable Array 46 the data in Data Generator And Comparator 74 is stored. These data values are then fetched as needed by the test algorithms. The Joint Interface 12 passes an initialization vector to load into Timer 72, Data Generator And Comparator 74 and Address Generator 76. The initialization vector is provided via the Hold pin of IC pins 14. State Machine 51 sends a command to State Machine 70 to start the initialization routine.

Upon completion of the initialization of Timer 72, Data Generator And Comparator 74 and Address Generator 76, the data in Data Generator and Comparator 74 is programmed, if desired, into Electrically Erasable Array 46. The programming of the data is under control of a test algorithm being executed by State Machine 70. State Machine 51 launches State Machine 70 with a single command to begin execution of a predetermined test algorithm. The data from Data Generator And Comparator 74 is stored in Electrically Erasable Array 46 at addresses initialized into Address Generator 76 in a portion of its memory that is not accessible to a user of the integrated circuit. That is, the user may not modify or read the data.

To implement a test, the State Machine 70 receives a command from State Machine 51 via Joint Interface 12. State Machine 70 controls algorithm execution associated with the received command by controlling Timer 72, Data Generator and Comparator 74 and Address Generator 76 and Mode Control signals sent to the Electrically Erasable Array 46. Certain tests are associated with the specified test algorithms that will cause data to be passed from Data Generator And Comparator 74 to an address in Electrically Erasable Array 46 specified by Address Generator 76. Data will also be received from Electrically Erasable Array 46 and be compared with an expected value by Data Generator And Comparator 74. If the result in the comparison results in an unexpected value, a fail indication is generated and sent to Joint Interface 12. For all cases when the algorithm fails or completes, the DONE indicator signal is asserted by the State Machine 70 to Joint Interface 12.

When the comparison performed by Data Generator And Comparator 74 results in a fail indication, pertinent fail information may be stored in a special non-volatile area of Electrically Erasable Array 46. It should be well understood that if Memory Interface 32 detects a fail indication, pertinent fail information is written to and recorded in a special non-volatile area of Flash Array 44, and so forth for Memory Interfaces 36 and 38. Such pertinent fail information may include, but is not limited to, the following: (1) identification of a specific sequence and algorithm in which the failure was detected obtained from Sequence Counter 52 and Algorithm Counter 54; (2) the cycle in which the failure was detected obtained from the Cycle Counter 56; (3) the address where the data comparison failed obtained from Address Generator 76; and (4) the data or information which was read at the time the comparison resulted in a fail indication obtained from Data Generator and Comparator 74. In one form, the information is ultimately connected from Data Generator and Comparator 74 to Electrically Erasable Array 46 as shown in FIG. 3. Other information in addition to fail information may be recorded in any of the memory arrays. For example, information indicating the running or the completion of a test may be recorded in the memory arrays. There are many forms in which the relevant data may be stored. For example, a pattern may be stored which identifies which data bits failed the comparison. When the fail data is stored within one of the memory arrays, the fail data is preferably stored in memory cells that are in addition to the user addressable portion of the memory arrays. Such additional memory typically exists even when redundancy is not provided and is typically invisible to an ultimate programmer or user of the memory arrays. When the memory arrays are non-volatile, the fail information remains available for failure analysis even if power is removed from the integrated circuit, thereby adding flexibility to testing the integrated circuit by not having to repeat the failure mechanism. Therefore, it should be appreciated that there has been provided a plurality of Memory Interface circuits that collectively implement customized test algorithms for a variety of specified memory arrays that may vary in characteristics.

Figure 4:
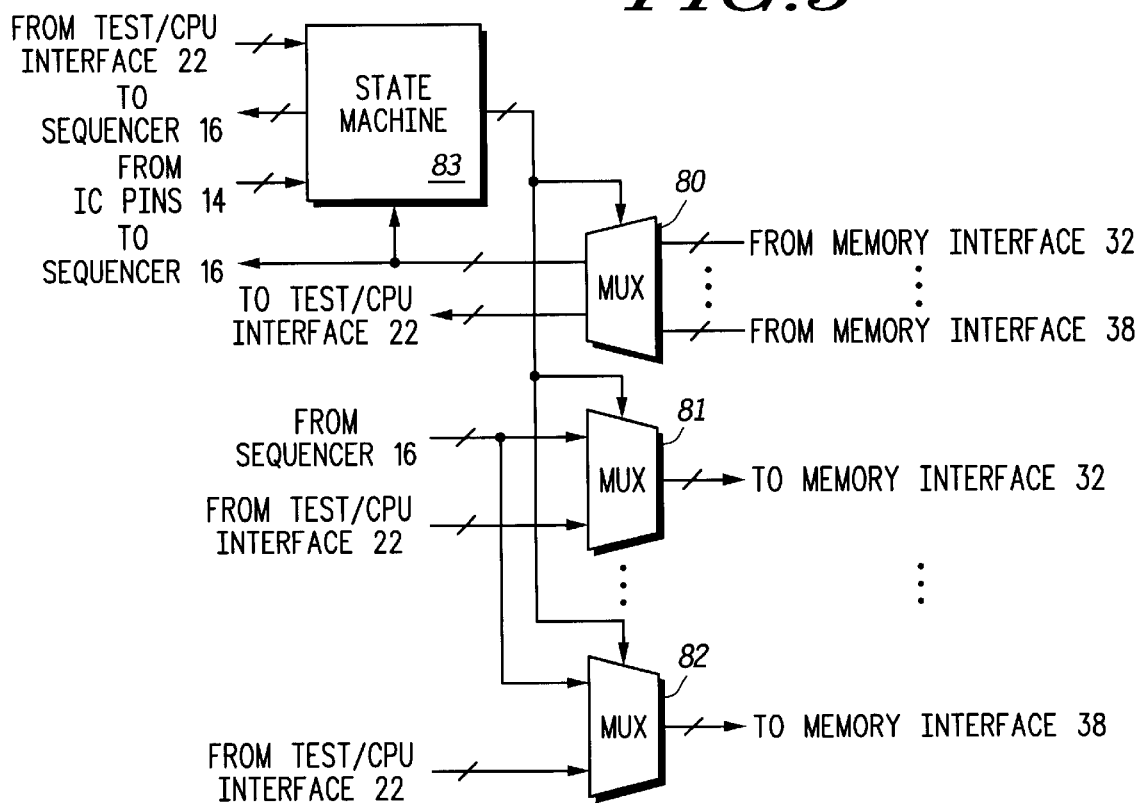
FIG. 4 illustrates in block diagram form one form of the joint interface of the built-in self-test system of FIG. 1.

Illustrated in FIG. 4 is one form of the Joint Interface 12 of FIG. 1. Joint Interface 12 has a State Machine 83 that has a first input connected to the IC pins 14. A first output of State Machine 83 is connected to Sequencer 16. A second input of State Machine 83 is connected to Test/CPU Interface 22 via a multi-bit bus that includes the MBIST Enable signal as one of its components. A second output of State Machine 83 is connected to a control input of each of a plurality of Multiplexers 80, 81 and 82. Multiplexer 80 has a plurality of inputs connected to each of the Memory Interfaces 32, 34, 36 and 38. For brevity, only two inputs are shown in FIG. 4. Multiplexer 80 has a first output connected to a third input of State Machine 83 and to Sequencer 16. Multiplexer 80 has a second output connected to Test/CPU Interface 22. Mulitplexer 81 has a first input connected to Sequencer 16 and a second input connected to Test/CPU Interface 22. An output of Multiplexer 81 is connected to Memory Interface 32. Multiplexer 82 has a first input connected to Sequencer 16 and has a second input connected to Test/CPU Interface 22. An output of Multiplexer 82 is connected to Memory Interface 38. Memory Interfaces 34 and 36 are similarly connected to multiplexers (not shown) as indicated by the dots between Multiplexer 81 and Multiplexer 82 in FIG. 4.

In operation, Joint Interface 12 functions as an interface jointly for all of the Memory Interfaces with a single Sequencer. State Machine 83 functions to control Multiplexers 80, 81 and 82 to implement the various test functions required of the test algorithms. State Machine 83 sends information to Sequencer 16 from its first output. Such information includes control (INVOKE and HOLD) and status information (FAIL and DONE). The initialization process described above functions to determine which of Multiplexers 81–82 are enabled to pass Sequencer 16 commands to the respective Memory Interface. If a command is not passed to a particular Memory Interface, the associated Memory Array consumes only stand-by power during the BIST operation. Hence, the present invention permits a substantial savings in power required to test the various Memory Arrays. To implement a test, Sequencer 16 commands are passed to the enabled Memory Interfaces via respective Multiplexers 81 through 82. Status information in the form of the DONE and FAIL indicators is received by Multiplexer 80 from all enabled Memory Interfaces and provided to Sequencer 16. If CPU 20 is executing the Sequencer, the CPU receives the DONE and FAIL information from Multiplexer 80. Additionally, State Machine 83 keeps track of fail information received from Multiplexer 80. When Sequencer 16 passes the BIST Fail Data described above in connection with FIG. 2 to Joint Interface 12, State Machine 83 enables the failed Memory Interface to receive the BIST Fail Data via a respective one of Multiplexers 81 through 82.

The inputs to Multiplexer 81 and Multiplexer 82 from Test/CPU Interface 22 are inputs used in a non-BIST mode of operation. The information transferred via Joint Interface 12 from Test/CPU Interface 22 originates from the CPU 20. The CPU 20 may execute the functionality of the Sequencer 16 by issuing BIST commands directly from the CPU 20. In such operation, a BIST operation may be implemented without the interaction of IC Pins 14. It should be further understood that initialization of the BIST System 10 may be accomplished by CPU 20 activity rather than by using IC Pins 14 (the HOLD pin and INVOKE pin).

Figure 5:
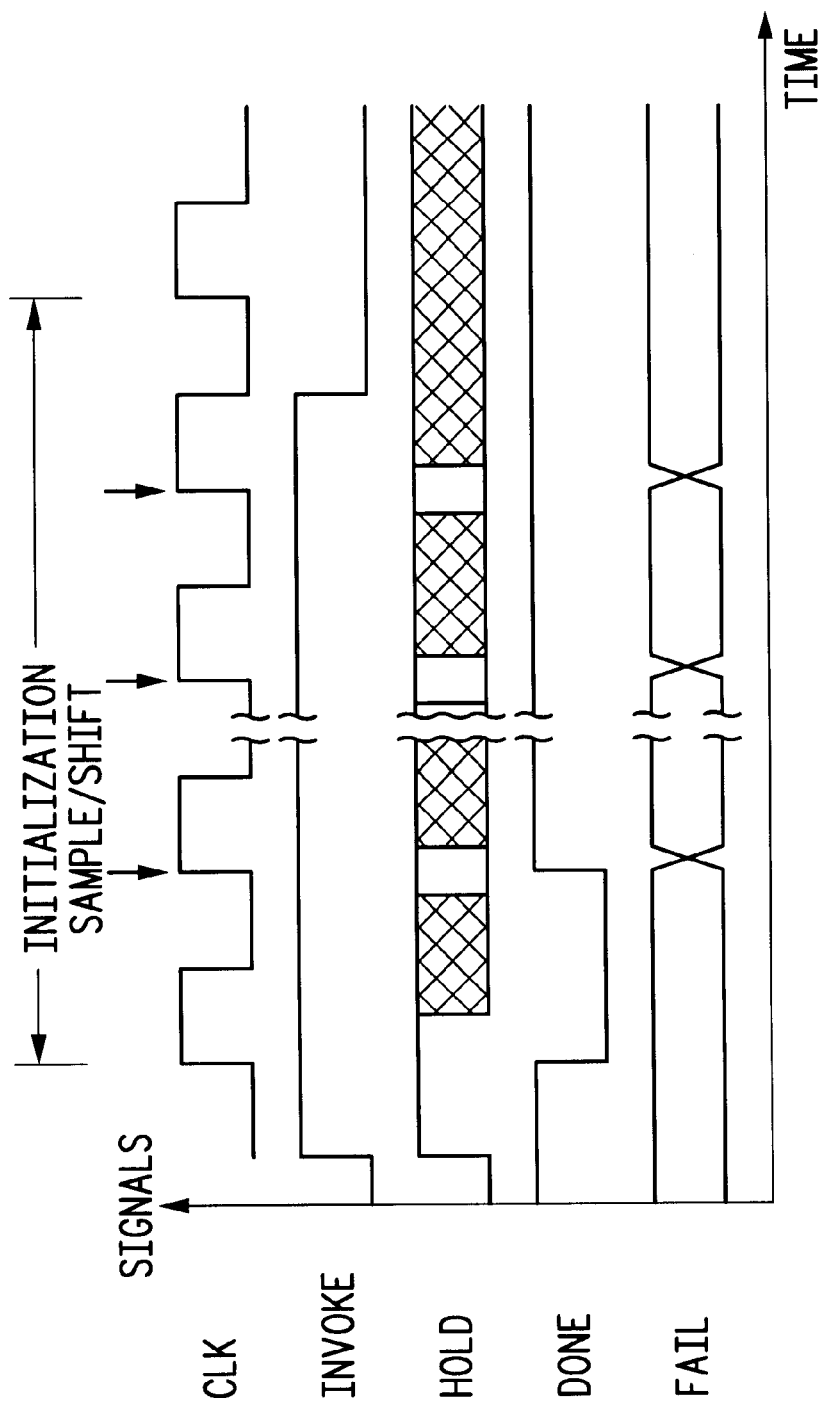
FIG. 5 illustrates in graphical form signals associated with an algorithm initialization mode of the built-in self-test system of FIG. 1.

Illustrated in FIG. 5 is a timing diagram of signals associated with BIST System 10 that further explains the operation of the Initialization mode. A synchronous signal labeled Clock (CLK) is understood to be routed to each of the functional elements of BIST System 10. In the illustrated form, a rising clock edge will trigger events although it should be well understood that a falling clock edge will equally suffice. Signals associated with each of the IC Pins 14 are assumed in FIG. 5 to illustrate one operation of the Initialization mode and may be driven/observed by a Tester (not shown). Assume for example that the INVOKE signal is an active high signal. To invoke the Initialization mode, both the INVOKE signal and the HOLD signal must be asserted (active high as illustrated) prior to a rising CLK edge. BIST System 10 responds by negating the DONE signal. Upon a next (or predetermined number of subsequent) rising CLK edge(s), the HOLD signal is sampled to provide the serial initialization information. As long as the INVOKE signal remains asserted, on subsequent rising CLK edges additional sampling of the HOLD signal occurs and the DONE signal is asserted to identify that at least one sampling event has occurred. This operation provides a chain of serial initialization information that is used as described above in connection with FIGS. 2, 3 and 4. Simultaneously, the current state of the BIST System 10 is sequentially driven to the FAIL pin of IC Pins 14 as illustrated in FIG. 5. The Initialization mode terminates when the INVOKE signal is negated as illustrated in FIG. 5. It should be appreciated that the Initialization vector that is sampled during the Initialization mode determines the entry point in a sequence of BIST algorithms. For example, assume that a BIST test sequence has ten predetermined ordered BIST algorithms to perform. Instead of always having to start with the first BIST algorithm in the sequence, the Initialization mode allows an external signal (i.e. the sampled information) to determine which one of the ordered BIST algorithms is executed first. From the entry point, BIST algorithm execution can proceed in sequential order if desired. That selection of the entry point is implemented based on the value of the information that is serially sampled during Initialization. Therefore, BIST System 10 permits an external signal to re-order BIST algorithms to be executed and to begin test algorithms at points in a test sequence other than at the beginning.

Figure 6:
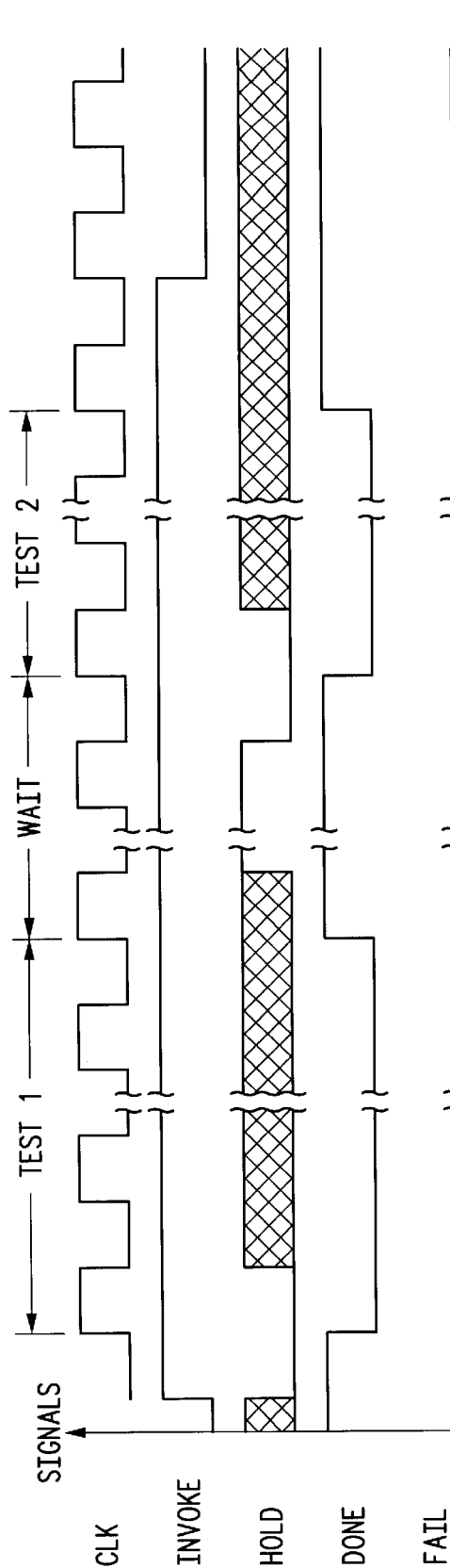
FIG. 6 illustrates in graphical form signals associated with a sequential algorithm execution mode of the built-in self-test system of FIG. 1.

Illustrated in FIG. 6 is a timing diagram of signals associated with a sequential algorithm execution mode of the BIST System 10. Assume the same clock signal CLK is provided. The sequential algorithm execution mode is entered upon a rising CLK edge when the INVOKE signal is asserted and the HOLD signal is negated. Algorithm Test One to be performed by one or more enabled Memory Interface circuits remains active. After completion by the Memory Interface circuit(s), the Memory Interface circuit(s) informs Sequencer 16 that the algorithm test is complete, and Sequencer 16 asserts the DONE signal in response. At that point Sequencer 16 waits. The BIST System 10 is capable of being self-suspended between tests to allow an external tester to control externally applied parameters, such as supply voltages or programming voltages, for the next test or tests. During the time when Sequencer 16 is waiting and the BIST System 10 is self-suspended, Sequencer 16 is waiting for the HOLD signal to transition to the active state. If the HOLD signal transitions to an active state, at this point in time Sequencer 16 increments counter 52 and counter 54. Subsequently, if the HOLD signal transitions to an inactive state, Sequencer 16 starts execution of Test Two upon the next rising CLK edge. In response, Sequencer 16 negates the DONE signal. Test Two is then performed as illustrated in FIG. 6 until the relevant Memory Interface circuit(s) complete the test and then Sequencer 16 asserts the DONE signal. Therefore, it should be appreciated that sequential algorithm execution may be performed with different test parameters required by tests which are desired to be performed sequentially.

Figure 7:
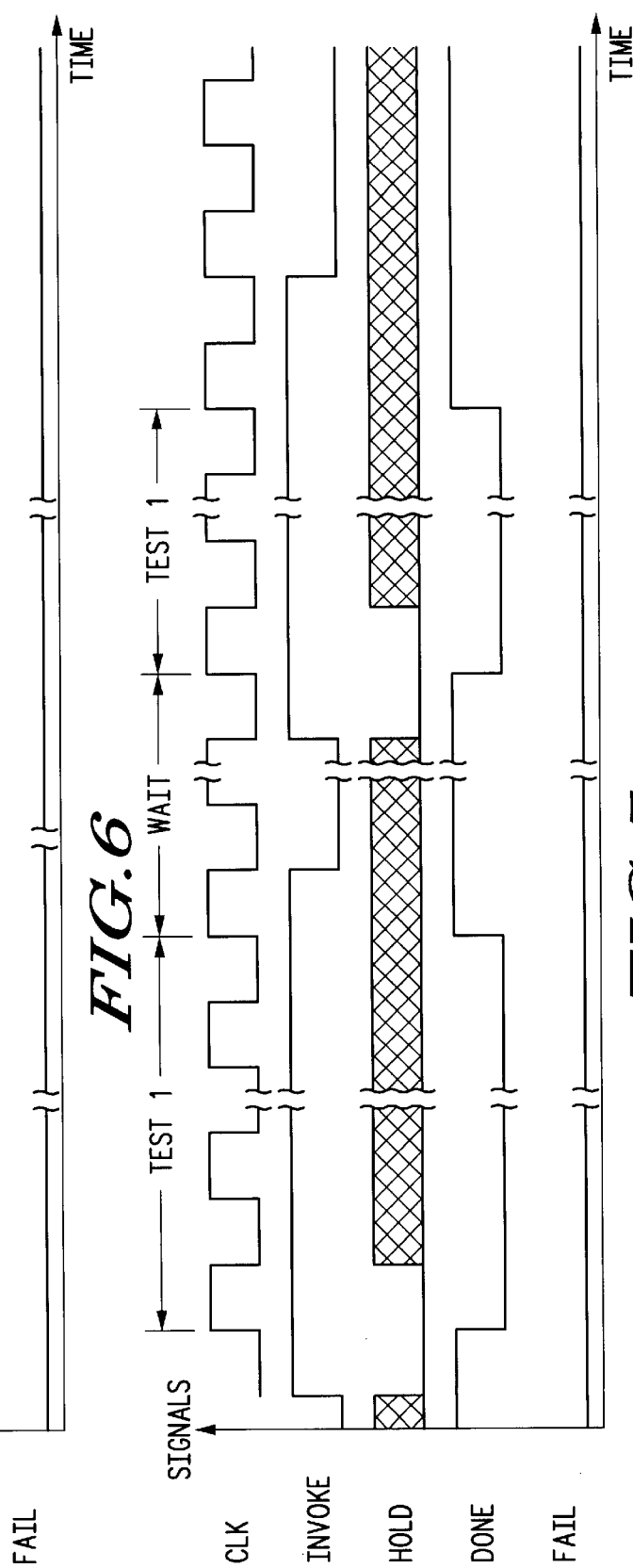
FIG. 7 illustrates in graphical form signals associated with a repetitive algorithm execution mode of the built-in self-test system of FIG. 1.

Illustrated in FIG. 7 is a timing diagram of signals associated with a repetitive algorithm execution mode of the BIST System 10. Assume the same clock signal CLK is provided. The repetitive algorithm execution mode is entered upon a rising CLK edge when the INVOKE signal is asserted and the HOLD signal is not asserted. Algorithm Test One to be performed by one or more enabled Memory Interface circuits remains active. After completion by the Memory Interface circuit(s), the Memory Interface circuit(s) informs Sequencer 16 that the algorithm test is complete, and Sequencer 16 asserts the DONE signal in response. At that point Sequencer 16 waits. The BIST System 10 is capable of being self-suspended between tests to allow an external tester to control externally applied parameters, such as supply voltages or programming voltages, before repeating the prior test. During the time when Sequencer 16 is waiting and the BIST System 10 is self-suspended, Sequencer 16 is waiting for the INVOKE signal to transition to the inactive state. If INVOKE transitions to an inactive state and returns to the active state with HOLD negated, Sequencer 16 starts re-execution of Test One upon the next rising CLK edge. In response, Sequencer 16 negates the DONE signal. Test One is then repeated as illustrated in FIG. 7 until the relevant Memory Interface circuit completes the test and then Sequencer 16 asserts the DONE signal. Therefore, it should be appreciated that repetitive algorithm execution may be performed with different test parameters for memory array characterization. This feature is very useful in repetitive testing, particularly for testing memories, such as non-volatile memories (NVMs). For example, the same test may be repeated and the BIST System 10 suspended between tests to permit the use of a tester to modify externally controlled test parameters such supply voltages or programming voltages.

By now it should be appreciated that there has been provided a multiple level BIST controller for use in an integrated circuit (IC) having embedded memories, particularly non-volatile memories. It should be well understood that the present invention may be used with memory that is either volatile or non-volatile. The present invention provides a tester the ability to test embedded memory sub-arrays independently to avoid any testing issues associated with embedded memory sub-arrays not operating in exact timing due to different parameters such as program and erase timing being unique to each memory array. Additionally, with the present invention a designer is able to customize embedded memory used in a single integrated circuit. For example, certain designs may require differing types of non-volatile memory (i.e. both EEPROM and Flash, varying data widths, varying memory depths) depending upon the functionality required. Such designs using multiple non-volatile memories, in the past, have not implemented BIST functionality. The present invention saves a significant amount of test cost by providing a common interface (via IC Pins 14) to all embedded non-volatile memories. The testing of the various memory sub-arrays with the BIST circuitry may be done concurrently, thereby saving time that is equivalent to saving money for manufacturers. The present invention may be used to test integrated circuits both at the die probe stage and at final test (packaged). Because the testing of an integrated circuit having multiple memory arrays is performed with only two input pins (INVOKE and HOLD) and one output pin (DONE) required to implement the various functions described herein, a large number of integrated circuits may be simultaneously tested with a single tester device. That is, because each of the multiple memory arrays does not require separate, dedicated input pins to be tested, only three pins per integrated circuit are required for a tester to connect to in addition to power supply voltages and clock signals. As a result, a tester is able to efficiently test a large number of integrated circuits having embedded multiple and varied memory arrays.

An additional advantage of the present invention relates to power consumption issues when trying to test multiple memory arrays on a single integrated circuit. It is desirable to test all of the memory arrays simultaneously. However, when all memory arrays are operational it is possible that too much power will be consumed causing erroneous test results. The present invention provides external control to be able to selectively power only some of the memory arrays and remain within known system power constraints of the integrated circuit. Therefore, easily controllable power management may be implemented within a BIST circuit when testing multiple memory arrays.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:

a memory array;

sequencer means for providing a sequencing control signal which identifies a test algorithm; and first memory interface means, coupled to the memory array and the sequencer means, for executing the test algorithm on the first memory array in response to the sequencing control signal, determining if the first memory array fails the test algorithm, and storing fail data in the first memory array if the first memory array fails the test algorithm.

2. The integrated circuit of claim 1, wherein the memory interface means comprises:

a state machine;

a data generator and comparator, coupled to the state machine and the memory array; and an address generator, coupled to the state machine and the memory array.

3. The integrated circuit of claim 1, wherein the fail data comprises information identifying the test algorithm that the memory array failed.

4. The integrated circuit of claim 1, wherein the fail data comprises information as to what data was detected in the memory array that constituted a failure.

5. The integrated circuit of claim 1, wherein the sequencer means provides additional sequencer signals representing additional algorithms and wherein the sequencer comprises:

a state machine;

counter means, coupled to the state machine, for tracking a sequence of the test algorithm and the additional algorithms; and a command mapper, coupled to the counter means, for providing the sequencing control signal and the additional sequencer signals to the first memory interface means.

6. A method of performing a built-in self-test of an integrated circuit having a memory, comprising:

providing a test means, coupled to the memory, for executing a plurality of algorithms, beginning with a first algorithm, on the memory and analyzing results from executing the algorithms; and executing at least the first algorithm; and storing at least some of the results in the memory.

7. The method of claim 6, wherein the test means comprises a sequencer means and a memory interface means.

8. In an integrated circuit having a non-volatile memory, a method of performing a built-in self-test, comprising:

executing a plurality of test algorithms on the non-volatile memory;

obtaining results from executing the plurality of test algorithms on the non-volatile memory; and storing at least some of the results in the non-volatile memory.

9. The method of claim 8, wherein the step of obtaining results comprises determining if the non-volatile memory has failed one of the plurality of test algorithms and providing fail data if the non-volatile memory did fail one of the plurality of test algorithms.

10. The method of claim 9, wherein the fail data comprises information identifying the test algorithm that the memory array failed.

11. The method of claim 9, wherein the fail data comprises information as to what data was detected in the memory array that constituted a failure.

12. An integrated circuit, comprising:

a memory array;

sequencer means for providing a sequencing control signal which identifies a test algorithm; and memory interface means, coupled to the memory array and the sequencer means, for executing the test algorithm on the memory array in response to the sequencing control signal, obtaining results from executing the test algorithm, and storing at least some of the results in the memory array.

13. The integrated circuit of claim 12, wherein the memory interface means is further characterized as determining if the memory array failed the test algorithm.

14. The integrated circuit of claim 13, wherein the memory interface means is further characterized as providing fail data if the memory array failed the test algorithm.

15. The integrated circuit of claim 14, wherein the memory interface means comprises:

a state machine;

a data generator and comparator, coupled to the state machine and the memory array; and an address generator, coupled to the state machine and the memory array.

16. The integrated circuit of claim 15, wherein the state machine receives the sequencing control signal from the sequencer.

17. An integrated circuit, comprising:

a memory array; and a test means, coupled to the memory array, for executing a test algorithm on the memory, obtaining results from executing the test algorithm, and storing at least some of the results in the memory array.

18. The integrated circuit of claim 17, wherein the test means is further characterized as determining if the memory array failed the test algorithm.

19. The integrated circuit of claim 18, wherein the test means is further characterized as providing fail data if the memory array failed the test algorithm.

20. The integrated circuit of claim 19, wherein the fail data comprises information identifying the test algorithm that the memory array failed.

21. The integrated circuit of claim 19, wherein the fail data comprises information as to what data was detected in the memory array that constituted a failure.

22. The integrated circuit of claim 19, wherein the fail data comprises information identifying an address of the memory array where the memory array failed.

23. The integrated circuit of claim 17, wherein the test means comprises a sequencer means and a memory interface means coupled between the memory array and the sequencer means.

* * * * *